United States Patent
Fang et al.

(10) Patent No.: US 10,747,254 B1
(45) Date of Patent: Aug. 18, 2020

(54) CIRCUIT STRUCTURE FOR ADJUSTING PTAT CURRENT TO COMPENSATE FOR PROCESS VARIATIONS IN DEVICE TRANSISTOR

(71) Applicant: GLOBALFOUNDRIES INC., Grand Cayman (KY)

(72) Inventors: Sher Jiun Fang, Allen, TX (US); See Taur Lee, Allen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/558,599

(22) Filed: Sep. 3, 2019

(51) Int. Cl.
  *G05F 3/24* (2006.01)
  *H03K 17/14* (2006.01)
  *G05F 3/26* (2006.01)

(52) U.S. Cl.
  CPC .............. *G05F 3/245* (2013.01); *G05F 3/262* (2013.01); *H03K 17/145* (2013.01)

(58) Field of Classification Search
  None
  See application file for complete search history.

(56) References Cited

U.S. PATENT DOCUMENTS

| | | | |
|---|---|---|---|
| 5,576,647 | A | 11/1996 | Sutardja et al. |
| 6,026,286 | A | 2/2000 | Long |
| 7,301,398 | B1 | 11/2007 | Allott et al. |
| 7,777,475 | B2 | 8/2010 | Spelling et al. |
| 8,554,162 | B2 | 10/2013 | Lindstrand et al. |
| 9,197,221 | B2 | 11/2015 | Babaie et al. |
| 9,442,509 | B2 * | 9/2016 | Casagrande ............ G05F 3/242 |
| 10,054,974 | B1 * | 8/2018 | Koe .................. H01L 29/78648 |
| 10,644,374 | B1 | 5/2020 | Lee et al. |
| 2003/0179131 | A1 | 9/2003 | Brosche |
| 2006/0006945 | A1 | 1/2006 | Burns et al. |
| 2008/0106335 | A1 | 5/2008 | Kimura |

(Continued)

OTHER PUBLICATIONS

Ueno et al., "A 300 nW, 15 ppm/°C, 20 ppm/V CMOS Voltage Reference Circuit Consisting of Subthreshold MOSFETs," IEEE Journal of Solid-State Circuits, vol. 44, No. 7, Jul. 2009, pp. 2047-2054.

(Continued)

*Primary Examiner* — Jeffery S Zweizig
(74) *Attorney, Agent, or Firm* — David Cain; Hoffman Warnick LLC

(57) ABSTRACT

The disclosure provides a circuit structure including a current source including at least one FDSOI transistor having a back-gate terminal, wherein the current source generates a current proportionate to an absolute temperature of the circuit structure; a first current mirror electrically coupled to the current source and a gate terminal of a device transistor, wherein the first current mirror applies a gate bias to the device transistor based on a magnitude of the current, and wherein a source or drain terminal of the device transistor includes an output current of the circuit structure; and an adjustable voltage source coupled to the back-gate terminal of the at least one FDSOI transistor of the current source, wherein the adjustable voltage source applies a selected back-gate bias voltage to the back-gate terminal of the at least one FDSOI transistor to adjust the current to compensate for process variations of the device transistor.

20 Claims, 9 Drawing Sheets

(56) References Cited

U.S. PATENT DOCUMENTS

2012/0064836 A1 3/2012 Bauwelinck et al.
2018/0367097 A1 12/2018 Martineau
2019/0296700 A1 9/2019 Lee et al.
2019/0296720 A1 9/2019 Lee et al.

OTHER PUBLICATIONS

Talebbeydokhti et al., "Constant Transconductance Bias Circuit with an On-Chip Resistor," School of Electrical Engineering and Computer Science, IEEE, 2006, pp. 2857-2860.
Dai et al., "A 14.4nW 122KHz Dual-phase Current-mode Relaxation Oscillator for Near-Zero-Power Sensors," Brown University, IEEE, 2015, 4 pages.
Guermandi et al., "A 79GHz Binary Phase-Modulated Continuous-Wave Radar Transceiver with TX-to-RX Spillover Cancellation in 28nm CMOS," ISSCC 2015 /Session 19 / Advanced Wireless Techniques / 19.7, pp. 354-356.
Jalli Ng et al., "A Fully-Integrated 77-GHz UWB Pseudo-Random Noise Radar Transceiver With a Programmable Sequence Generator in SiGe Technology," IEEE Transactions on Circuits and Systems—I: Regular Papers, vol. 61, No. 8, Aug. 2014, 12 pages.
Trotta et al., "A 79GHz SiGe-Bipolar Spread-Spectrum TX for Automotive Radar," ISSCC 2007 / Session 23 / Broadband RF and Radar / 230.7, 3 pages.
Chee et al., "An Ultra-Low Power Injection Locked Transmitter for Wireless Sensor Networks," IEEE 2005, Custom Integrated Circuits Conference, 4 pages.

\* cited by examiner

US 10,747,254 B1

CIRCUIT STRUCTURE FOR ADJUSTING PTAT CURRENT TO COMPENSATE FOR PROCESS VARIATIONS IN DEVICE TRANSISTOR

TECHNICAL FIELD

Embodiments of the disclosure relate generally to circuit structures, and more particularly, to circuit structures for generating current output that can compensate for process variations in a device transistor. The various embodiments described herein can be used in a variety of applications, e.g., analog circuits requiring temperature-dependent voltage biasing or a bias voltage.

BACKGROUND

In electrical hardware, a transistor is a critical component for implementing digital and analog circuitry designs. By applying different voltages to the transistor's gate terminal, the flow of electric current between its source terminal and the drain terminal of the transistor can be controlled. In digital circuits, the presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor to affect the flow of electrical current between source and drain terminals of each transistor. These attributes cause a transistor to be a fundamental component in signal processing circuitry, e.g., RF amplifiers, oscillators, filters, etc.

When implemented into a circuit, transistors may allow a circuit structure to perform a variety of functions including, e.g., power amplification, conversion between analog and digital signals, voltage biasing and inversion, etc. Networks of interconnected transistors may provide various functions for digital and/or analog circuits, such as providing a current or voltage that is proportionate to environmental parameters, e.g., temperature.

SUMMARY

A first aspect of the present disclosure provides a circuit structure including: a current source including at least one fully depleted semiconductor on insulator (FDSOI) transistor having a back-gate terminal, wherein the current source generates a current proportionate to an absolute temperature of the circuit structure; a first current mirror electrically coupled to the current source and a gate terminal of a device transistor, wherein the first current mirror applies a gate bias to the device transistor based on a magnitude of the current, and wherein a source or drain terminal of the device transistor includes an output current of the circuit structure; and an adjustable voltage source coupled to the back-gate terminal of the at least one FDSOI transistor of the current source, wherein the adjustable voltage source applies a selected back-gate bias voltage to the back-gate terminal of the at least one FDSOI transistor to adjust the current to compensate for process variations of the device transistor.

A second aspect of the present disclosure provides a method for calibrating a circuit having a proportional to absolute temperature (PTAT) current source coupled to a gate of a device transistor, a source or drain terminal of the device transistor including an output current of the circuit, the method including: applying a fixed current to a drain terminal of a calibration transistor, the calibration transistor including a gate terminal coupled to the drain terminal and a source terminal coupled to ground, wherein the calibration transistor is a replica of the device transistor and the voltage of the drain terminal defines a calibration voltage; applying a test voltage to a back-gate terminal of at least one fully depleted semiconductor on insulator (FDSOI) transistor of the PTAT current source to adjust a PTAT current generated with the PTAT current source; applying a mirror of the adjusted PTAT current to a reference resistor, wherein a voltage across the reference resistor defines a reference voltage for calibration; adjust a magnitude of the test voltage in response to detecting the reference voltage as unequal to the calibration voltage; and applying the test voltage as a selected back-gate voltage bias in response to detecting the reference voltage as equal to the calibration voltage.

A third aspect of the present disclosure provides a circuit structure including: a current source having a plurality of transistors and configured to generate a proportional to absolute temperature (PTAT) current, wherein the plurality of transistors includes at least one fully depleted semiconductor on insulator (FDSOI) transistor having a back-gate terminal, wherein the current source further includes an additional FDSOI transistor having a respective back-gate terminal, and wherein the respective back-gate terminal is coupled to a resistor-capacitor (RC) circuit configured to transition the current source from operating in a metastable condition to a stable condition; a first current mirror configured to apply a gate bias to a device transistor based on a magnitude of the PTAT current, wherein a source or drain terminal of the device transistor includes an output current of the circuit structure; an adjustable voltage source coupled to the back-gate terminal of the at least one FDSOI transistor of the current source and configured to apply a selected back-gate bias voltage thereto, wherein the selected back-gate bias voltage adjusts the PTAT current to compensate for process variations of the device transistor; a second current mirror coupled to a reference resistor and configured to apply the PTAT current to the reference resistor, wherein a voltage across the reference resistor defines a reference voltage; and a calibration transistor having a drain terminal coupled to a fixed current source and a gate terminal of the calibration transistor, and a source terminal coupled to ground, wherein a voltage at the drain terminal of the calibration transistor defines a calibration voltage, and the calibration transistor is a replica of the device transistor, wherein the selected back-gate bias voltage causes the reference voltage to be equal to the calibration voltage; and an adjustable voltage source coupled to the back-gate terminal of the at least one FDSOI transistor of the current source and configured to apply a selected back-gate bias voltage thereto, wherein the selected back-gate bias voltage adjusts the PTAT current to compensate for process variations of the device transistor;

a second current mirror coupled to a reference resistor and configured to apply the PTAT current to the reference resistor, wherein a voltage across the reference resistor defines a reference voltage; and a calibration transistor having a drain terminal coupled to a fixed current source and a gate terminal of the calibration transistor, and a source terminal coupled to ground, wherein a voltage at the drain terminal of the calibration transistor defines a calibration voltage, and the calibration transistor is a replica of the device transistor, wherein the selected back-gate bias voltage causes the reference voltage to be equal to the calibration voltage.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
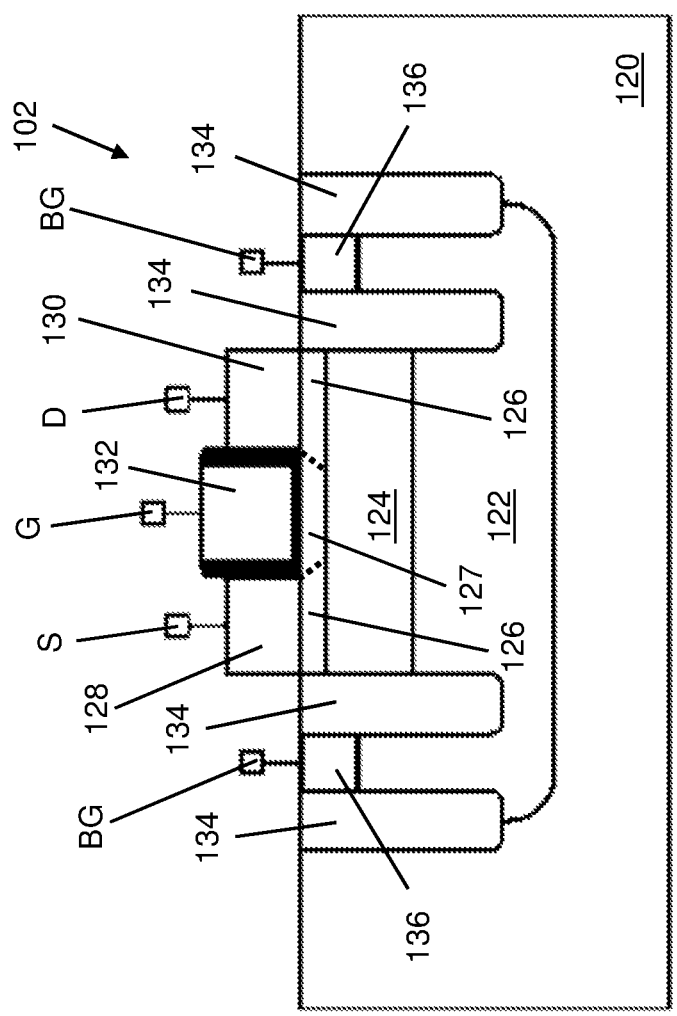
FIG. 1 shows a cross-sectional view of a fully depleted semiconductor-on-insulator (FDSOI) transistor for a circuit structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a circuit structure for calibrating a proportional to absolute temperature (PTAT) current source to account for process variations of a transistor for supplying a current output, e.g., for power amplification or other device functions. A "PTAT circuit" may refer to one of several possible circuit configurations for outputting a bias voltage or current that varies proportionately with respect to the absolute temperature of the circuit, which may be measured in Kelvins (K). PTAT circuits may have a variety of different circuit architectures based on need, deployment setting, etc., and thus may include a wide variety of connections between transistors, resistors, capacitors, as well as differential or non-differential supply voltages and/or other device elements. Conventional PTAT circuit architectures, however, have not successfully eliminated the influence of manufacturing or structural-related variables (collectively, "process variables" or "process sensitivity") on the voltage-temperature or current-temperature profiles of a PTAT circuit. Conventional calibration algorithms do not successfully account for all of the process variables of an individual transistor, or otherwise require substantial time and cost to implement on every device.

Embodiments of the present disclosure provide a circuit structure and method which uses fully depleted semiconductor on insulator (FDSOI) transistor technology to embed calibration features into a PTAT current structure to compensate for process variables with a single calibration. A circuit structure according to embodiments of the disclosure may include, e.g., a PTAT current source according to one of any currently known or later developed architectures, but including at least one or more FDSOI transistors with an associated back-gate terminal. A first current mirror, configured to replicate the PTAT current of the PTAT current source, biases the gate terminal of a "device transistor" with the replicated current. In embodiments of the disclosure, the term "device transistor" refers to a transistor of interest coupled at its gate to a replicated PTAT current source. The device transistor may be part of a power amplifier, frequency amplifier, and/or other amplifier or non-amplifier circuit (e.g., a filter, oscillator, etc.) with one or more transistors. Circuit structures according to the disclosure do not necessarily include other remaining portions of a device where the "device transistor" is implemented, so long as the device transistor is coupled at its gate to a node having the replicated PTAT current and corresponding voltage. The applied gate bias causes the device transistor to exhibit an output current at its source or drain. An adjustable current source is coupled to the back-gate terminal of the FDSOI transistor(s) of the PTAT current source. The back-gate voltage applied to the FDSOI transistor(s) will adjust the magnitude of the PTAT current output from the PTAT current source to compensate for process variations of the device transistor. Process variations of the device transistor include, e.g., manufacturing-based variations between the expected behavior of the transistor and its actual behavior when formed on a specific wafer or in part of a device. To calibrate the circuit, an operator may compare the PTAT output current with its expected value(s), and adjust the back-gate voltage applied to the FDSOI transistor(s) to compensate for all process variations of the device transistor, without evaluating the cause of the process variations.

Turning to FIG. 1, a cross-sectional view of a fully depleted semiconductor on insulator (FDSOI) transistor 102, which may be deployed, e.g., in structures and methods according to the disclosure, is shown. It is emphasized that in various embodiments, all transistors in a circuit structure according to embodiments of the disclosure may take the form of FDSOI transistor 102 regardless of whether back-gate terminals are specifically shown in the accompanying diagrams. Thus, any and all transistors discussed herein and shown in the accompanying FIGS. may take the form of FDSOI transistor 102. FDSOI transistor 102 and components thereof can be formed on and within a substrate 120. Substrate 120 can include any currently known or later-developed semiconductor material including, e.g., doped or undoped silicon and/or other currently known or later developed semiconductor materials suitable for use in microelectronics. A back-gate region 122, alternatively identified as an n-type or p-typed doped well region, of substrate 120 can be implanted with one or more doping compounds to change the electrical properties thereof. Thus, back-gate region 122 can include the same material composition as the remainder of substrate 120, but can additionally include dopant materials therein. A buried insulator layer 124, also known in the art as a "buried oxide" or "BOX" layer, can separate back-gate region 122 of substrate 120 from source/drain regions 126 and a channel region 127 of FDSOI transistor 102. Buried insulator layer 124 may be composed of one or more oxide compounds, and/or any other currently known or later-developed electrically insulative substances. The use of FDSOI technology provides various advantages such as an adjustable electric potential within back-gate region 122 of FDSOI transistor 102.

Source/drain regions 126 and channel region 127 may electrically couple a source terminal 128 of FDSOI transistor 102 to a drain terminal 130 of FDSOI transistor 102 when transistor is in on state. A gate stack 132 can be positioned over channel region 127, such that a voltage of gate node G controls the electrical conductivity between source and drain terminals 128, 130 through source/drain regions 126 and channel region 127. Gate stack 132 can have, e.g., one or more electrically conductive metals therein, in addition to a gate dielectric material (indicated with black shading between bottom of stack and channel region 127) for separating the conductive metal(s) of gate stack 132 from at least channel region 127. A group of trench isolations 134, in addition, can electrically and physically separate the various regions of FDSOI transistor 102 from parts of other transistors. Trench isolations 134 may be composed of any insulating material such as $SiO_2$ or a "high-k" dielectric having a high dielectric constant, which may be, for example, above 3.9. In some situations, trench isolations 134 may be composed of an oxide substance.

Back-gate region 122 can be electrically coupled to back-gate node BG through back-gate terminals 136 within substrate 120 to further influence the characteristics of FDSOI transistor 102, e.g., the conductivity between source and drain terminals 128, 130 through source/drain regions 126 and channel region 127. Applying an electrical potential to back-gate terminals 136 at back-gate node BG can induce an electric charge within back-gate region 122. The induced charge creates a difference in electrical potential between back-gate region 122, source/drain regions 126, and channel region 127 across buried insulator layer 124. Among other effects, this difference in electrical potential between back-gate region 122 and source/drain regions 126, channel region 127, of substrate 120 can affect the threshold voltage of FDSOI transistor 102, i.e., the minimum voltage for inducing electrical conductivity across source/drain region 126 and channel region 127 between source and drain terminals 128, 130, as discussed herein.

Applying a back-gate biasing voltage to back-gate terminals 136 can lower the threshold voltage of FDSOI transistor 102, thereby reducing source drain resistance and increasing drain current, relative to the threshold voltage of FDSOI transistor 102 when an opposite voltage bias is applied to back-gate terminals 136. These characteristics of FDSOI transistor 102, among other things, can allow a reduced width (saving silicon area) relative to conventional applications and transistor structures.

In an example embodiment, a width of source/drain and channel regions 126, 127 (i.e., into and out of the plane of the page) can be between approximately 0.3 micrometers (μm) and approximately 2.4 μm. A length of source/drain and channel regions 126, 127 (i.e., left to right within the plane of the page) between source and drain terminals 128, 130 can be, e.g., approximately twenty nanometers (nm). FDSOI technology transistors, e.g., FDSOI transistor 102, offer the ability to apply a voltage bias to back-gate region 122 to manipulate the threshold voltage $V_t$ (i.e., minimum voltage for channel formation) of FDSOI transistor 102 Back-gate region 122 can allow a user to manipulate the threshold voltage of gate stack 132 to control the channel formation within channel region 127. Back-gate region 122 can thus be cross-coupled to other portions of a circuit structure, e.g., to affect the passage of current between source and drain terminals 128, 130.

Figure 2:
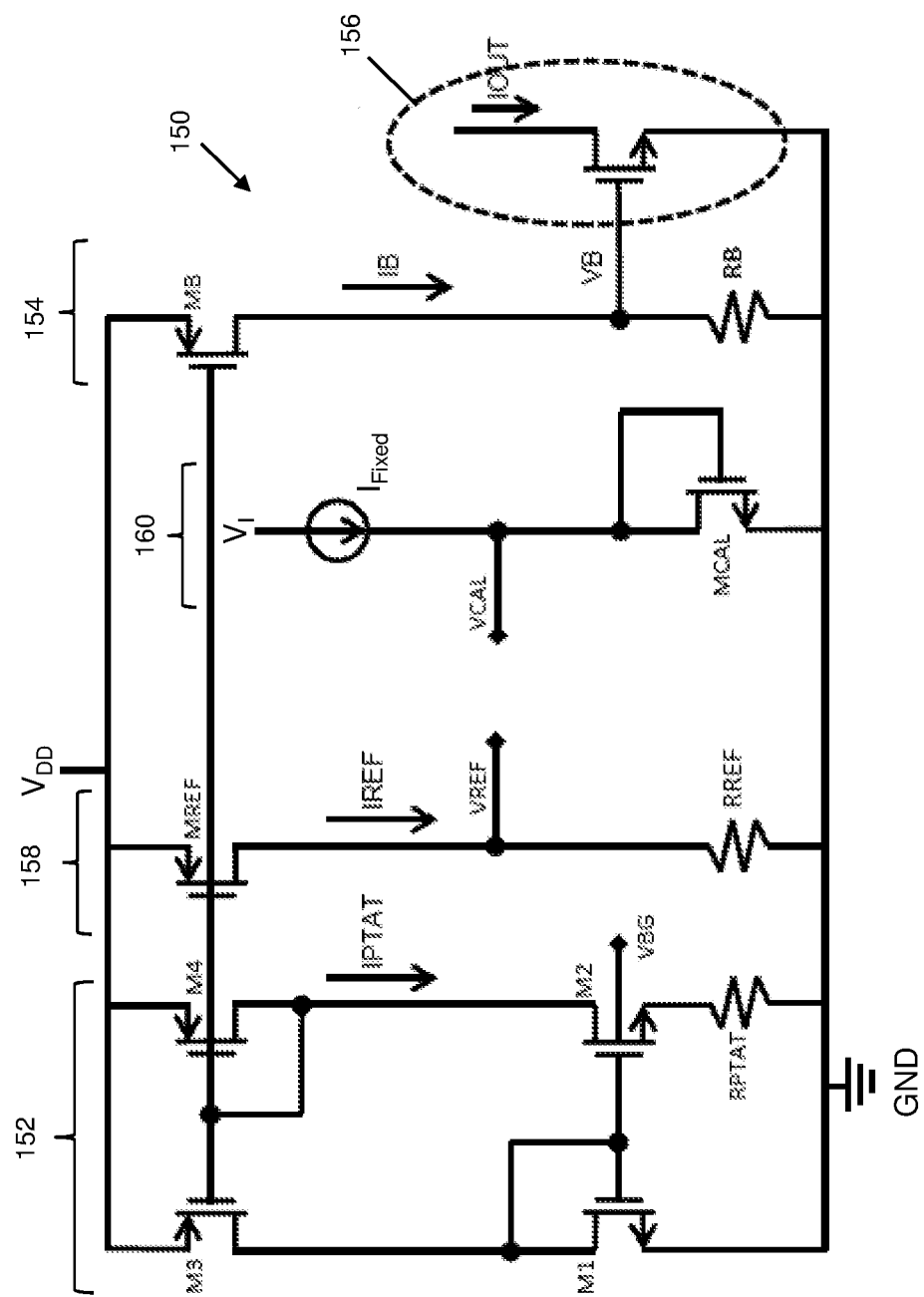
FIG. 2 shows a schematic view of a circuit structure according to embodiments of the disclosure.

Turning to FIG. 2, a schematic view of a circuit structure 150 according to embodiments of the disclosure is shown. Circuit structure 150 may include a group of sub-circuits each electrically coupled to one supply voltage $V_{DD}$ at one terminal and/or ground GND at an opposing terminal. Circuit structure 150 may include a PTAT current source 152 including a plurality of transistors M1, M2, M3, M4 electrically coupled between supply voltage $V_{DD}$ and ground GND. All transistors M1, M2, M3, M4 may be in the form of FDSOI transistors, e.g., as shown in FIG. 1, but one or more conventional transistors may also be used in some alternative examples. Each transistor M1, M2, M3, M4 thus may include a back-gate terminal, even where not specifically shown in circuit structure 150 as depicted in FIG. 2. Transistors M1, M2, M3, M4 may work in tandem to generate a PTAT current ("IPTAT") that is proportionate to the absolute temperature of circuit structure 150. FIG. 2 illustrates PTAT current source 152 as including two differential pairs of transistors with gates coupled to the source terminal of another transistor at a shared node. For example, the gate terminals of transistors M1, M2 are coupled to the source terminal of transistor M1, while the gate terminals of transistors M3, M4 are coupled to the source terminal of transistor M4. During operation, the electrical couplings between supply voltage $V_{DD}$ and PTAT current source 152, and the electrical couplings between transistors M1, M2, M3, M4 of current source 152, cause PTAT current IPTAT to be generated.

At least one transistor, or all transistors M1, M2, M3, M4, may take the form of an FDSOI transistor (e.g., as shown in FIG. 1 and discussed above) having a back-gate terminal. In the example of FIG. 2, transistor M2 is specifically shown to be an FDSOI transistor but it is possible for all of the other transistors M1, M3, M4, of PTAT current source 152 to be an FDSOI transistor. Transistor M2 of PTAT current source 152 is electrically coupled to an adjustable voltage source VBG for controlling properties of the transistor, e.g., its threshold voltage. PTAT current source 152 may be coupled to ground GND through a PTAT resistor RPTAT.

Circuit structure 150 also includes a first current mirror 154 for replicating the magnitude of the generated PTAT current IPTAT as a bias current IB. First current mirror 154 may include an access transistor MB for interconnecting PTAT current source 152 with first current mirror 154, thereby allowing current mirror 154 to replicate the PTAT current in PTAT current source 152. Bias current IB may be coupled to the gate terminal of a device transistor 156. As previously discussed herein, device transistor 156 may be part of a power amplifier, frequency amplifier, and/or other amplifier or non-amplifier circuit (e.g., a filter, oscillator, etc.), and other portions of a circuit where device transistor 156 appears are omitted solely for ease of illustration. Current mirror 154 replicates the PTAT current from PTAT current source 152 as a bias current IB applied to the gate of device transistor 152. A bias voltage VB indicates the gate bias applied to device transistor 156 from first current mirror 154. Device transistor 156 may have an output current TOUT at its source or drain terminal. Voltage bias VB at the gate of device transistor 156 may control the magnitude of output current TOUT, to provide a current output that is independent of variations in power supply and/or resistivity in circuit structure 150. Voltage bias VB, in turn, may be defined using a device resistor RB connected between the gate terminal of device transistor 156 and ground GND. To eliminate resistivity variations in circuit structure 150, device resistor RB may have the same material composition as resistor RPTAT. Using the same material in each resistor RB, RPTAT will cause bias voltage VB to be independent of any differences in resistivity between each resistor RB, RPTAT. Output current TOUT at the drain terminal of device transistor 156 thus will be independent of changes in temperature, supply voltage, and/or resistance. Circuit structure 150 is also operable to control bias voltage VB to compensate for process variations in device transistor 156 as described herein.

Embodiments of circuit structure 150 permit modifying the emitted PTAT current IPTAT to account for process variations of device transistor 156. The voltage of adjustable voltage source VBG of circuit structure 150 may be changed to ensure that the magnitude of output current TOUT is independent of any process variations specific to device transistor 156 and/or the wafer in which it is manufactured. In a simplified example, a user may operate circuit structure 150 in a test mode and measure the output current TOUT produced in the test mode. In cases where the output current TOUT does not substantially match estimated or desired values, the user may apply varying amounts of back-gate voltage to PTAT current source 152 until achieving a desired output current magnitude and/or temperature sensitivity. After circuit structure 150 is deployed in a device, the back-gate voltage applied to PTAT current source 152 may be held at the selected level to compensate for process variations of device transistor 156. As will be discussed herein, embodiments of circuit structure 150 may also include various components for automatically selecting and applying a back-gate voltage to PTAT current source 152 which compensates for process variations of device transistor 156.

According to an example, circuit structure 150 may include a second current mirror 158 controlled by an access transistor MREF. Access transistor MREF of second current mirror 158 may selectively allow IPTAT from PTAT current source 152 to be transmitted to a reference resistor RREF connected between access transistor MREF and ground GND. The mirrored electrical current in second current mirror 158 may be indicated as IREF, as shown. The reference voltage of second current mirror 158 thus may be substantially equal to the voltage across PTAT resistor RPTAT, and moreover may be used for calibrating the performance of PTAT current source 152 based on a calibration transistor as described herein.

Figure 3:
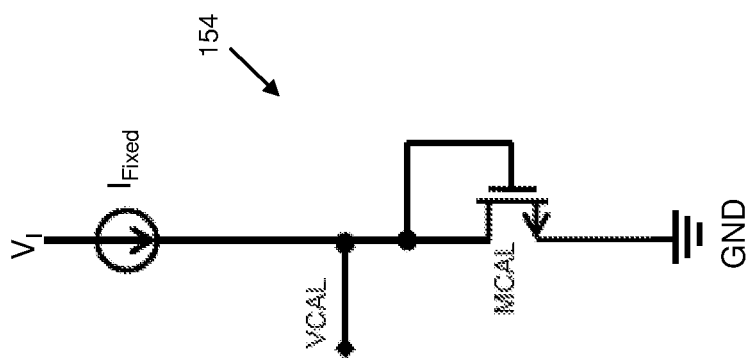
FIG. 3 shows a schematic view of a calibration circuit for a circuit structure according to embodiments of the disclosure.

Referring briefly to FIGS. 2 and 3 together, a calibration circuit 160 may include a calibration transistor MCAL for comparing the reference voltage with the process sensitivity of transistors in a device. Calibration transistor MCAL may be a replica of device transistor 156, e.g., by being manufactured from the same semiconductor wafer using the same tools and settings used to produce device transistor 156. Calibration circuit 160 may be included in circuit structure 150 as shown, e.g., in FIG. 2, or may be structurally and/or operationally independent as part of a calibration device. In any event, calibration transistor MCAL may take the form of a "diode connected transistor," i.e., a transistor featuring a gate terminal directly coupled to its drain terminal.

Calibration transistor MCAL may be coupled to an external fixed current source $I_{Fixed}$ coupled to its gate and source or drain terminals, and coupled to ground GND at its opposing source or drain terminal. A calibration node VCAL may also be coupled to the gate and source or drain terminals of calibration transistor MCAL. Calibration transistor MCAL will exhibit the same process variations as device transistor 156, e.g., due to being formed as a replica of device transistor 156 and thus having the same electrical behavior. To identify which back-gate voltage will compensate for the process variations of device transistor 156, a user may monitor reference voltage VREF and calibration voltage VCAL after applying a test voltage. To calibrate circuit structure 150, back-gate voltage VBG is periodically adjusted until reference voltage VREF is equal to calibration voltage VCAL. When the two voltages are equal, the selected back-gate voltage has caused PTAT current source 152 to compensate for the process variations of device transistor 156. Where second current mirror 158 and calibration circuit 160 are included together with PTAT current source, first current mirror 154, and device transistor 156 on a single device, only a single calibration is needed. In subsequent operation, continuously applying the same back-gate voltage will compensate for the process variations of device transistor 156, because such variations are independent of other variables (e.g., temperature, voltage supply, resistance, etc.).

Figure 4:
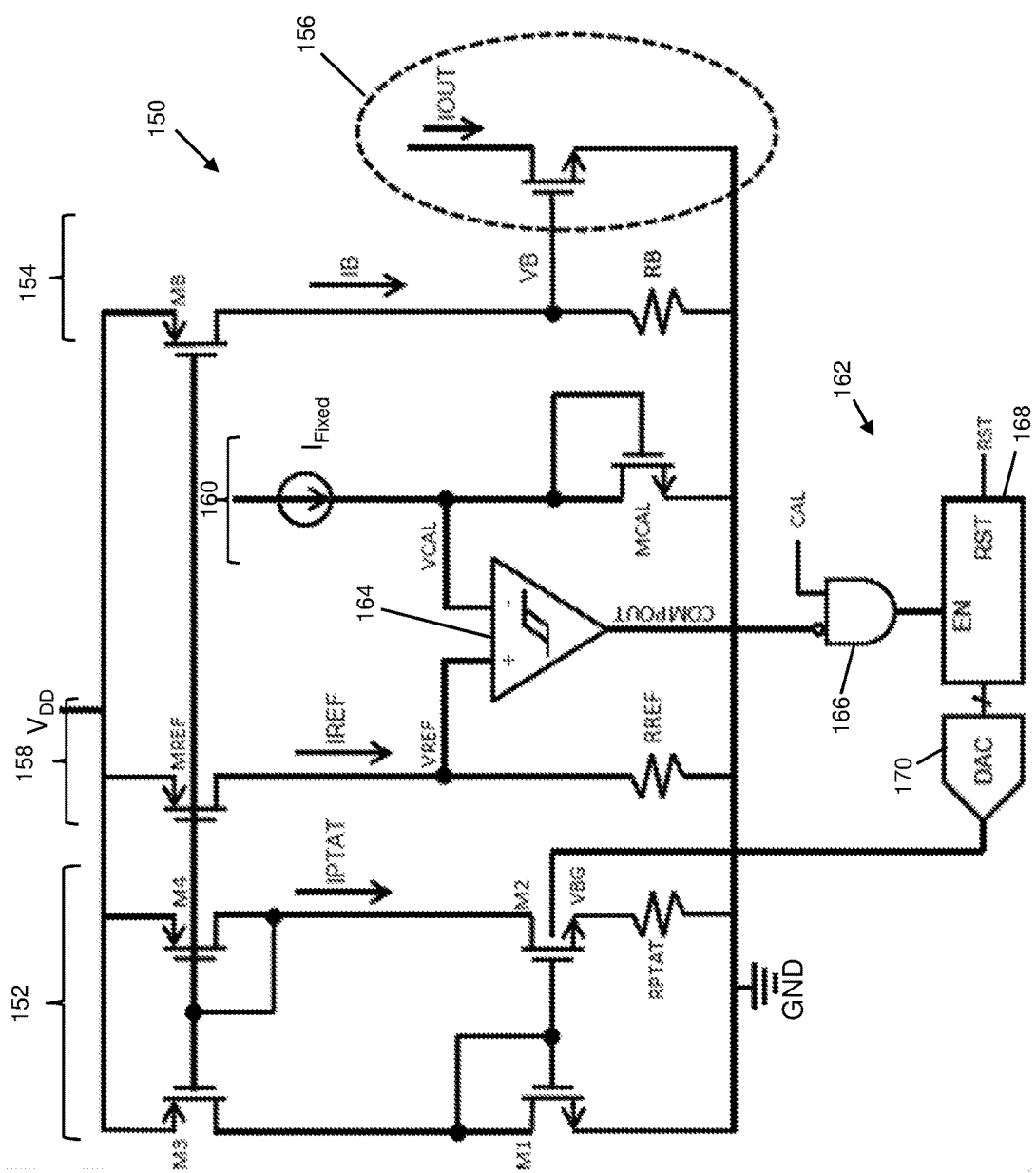
FIG. 4 shows a schematic view of a circuit structure with a calibration engine according to embodiments of the disclosure.

Turning to FIG. 4 embodiments of circuit structure 150 may be coupled to and/or structurally integrated with a calibration engine 162 for automatically applying test voltages to the back gate terminal of PTAT current source 156, and identifying whether reference voltage VREF equals calibration voltage VCAL. Calibration engine 162 may include, e.g., a differential comparator 164 having two input lines for measuring reference voltage VREF and calibration voltage VCAL, respectively. Differential comparator 164 may output a selected digital voltage (indicating, i.e., a "one" or "zero") at its output line COMPOUT when detecting that reference and calibration voltages VREF, VCAL are equal to each other. Differential comparator 164 conversely may output the opposite digital voltage when detecting that voltages VREF, VCAL are not equal to each other. An enabling gate 166 may be coupled to an enabling node "EN" of controller 168 to govern whether calibration engine 162 is active or inactive. An enabling input "CAL" may be set to a predetermined digital voltage when calibration engine 162 operates, thereby allowing controller 168 to identify whether differential comparator 164 has detected equality or inequality between voltages VREF, VCAL. Where enabling gate 166 is disabled, the voltage of input "CAL" will be set to the opposite value such that controller 168 will not continue to detect the output from differential comparator 164.

Controller 168 may be electrically coupled to a digital-to-analog converter (DAC) 170 for controlling the adjustable back-gate bias voltage applied to PTAT current source. Controller 168 may transmit a digital code to DAC 170, which in turn transmits a selected back-gate voltage bias to FDSOI transistor(s), e.g., transistor M2, of PTAT current source 152 via an electrical coupling. Controller 168 optionally may include a reset input "RST" which causes DAC 170 to cease applying a selected back-gate bias to PTAT current source 152, and/or reset the applied voltage to an initial test voltage for re-calibration and/or testing of another circuit structure 150. During operation, controller 168 of calibration engine 162 may issue digital codes to DAC 170, which causes DAC 170 to successively apply test voltages to the back-gate terminal of at least one FDSOI transistor of PTAT current source 152. The digital codes may be generated automatically through a counter component of DAC 170, which may be independent of controller 168, and/or an operator of circuit structure 150. Controller 168 additionally may adjust a magnitude of the test voltage when detecting voltages VREF, VCAL as being unequal, and continue applying the test voltage as a selected back-gate voltage bias upon detecting VREF, VCAL as being equal to each other.

Figure 5:
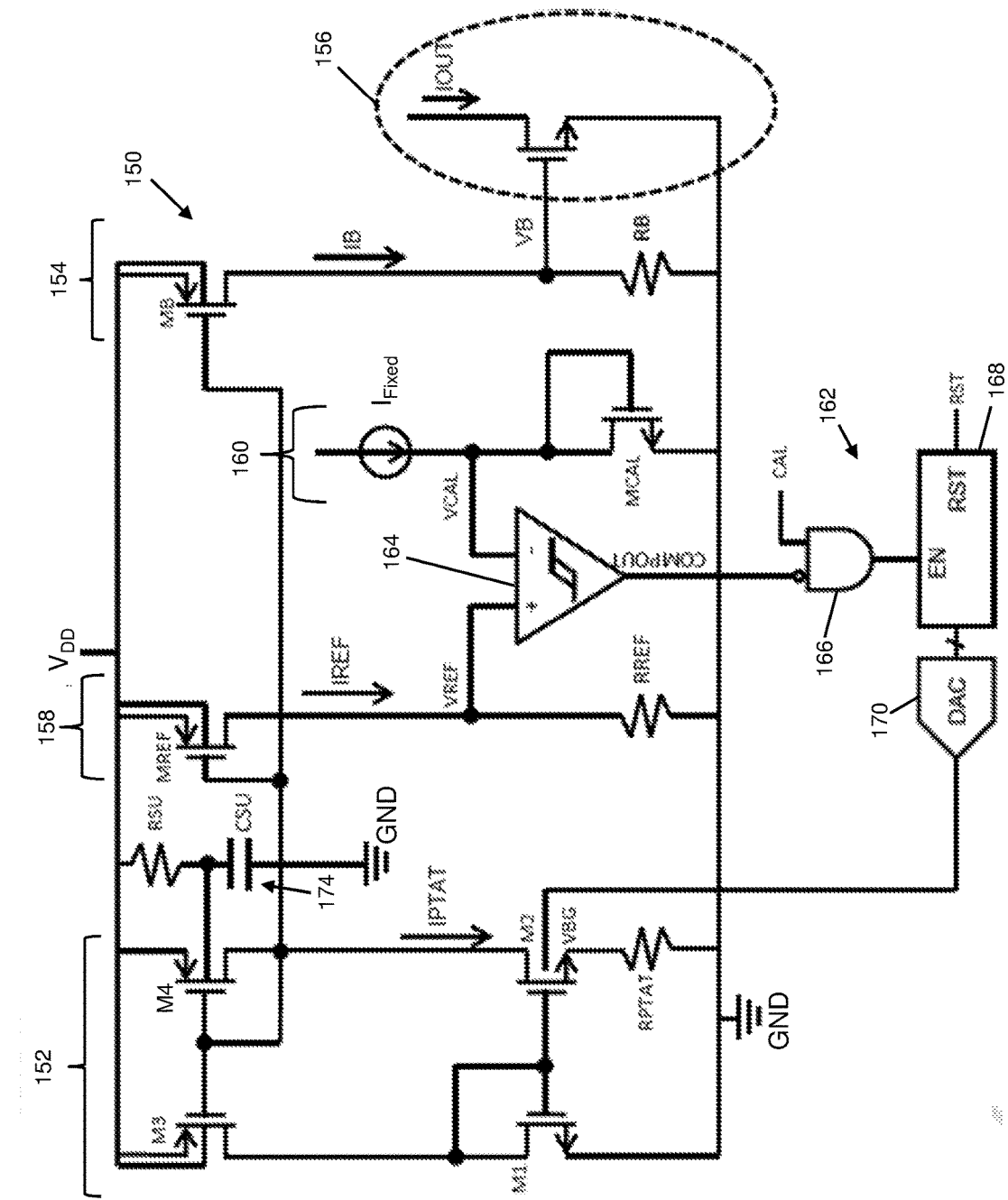
FIG. 5 shows a schematic view of a circuit structure with a resistor-capacitor (RC) circuit and calibration engine according to embodiments of the disclosure.

Referring now to FIG. 5, circuit structure 150 may include components to further stabilize the generated PTAT current IPTAT. Specifically, PTAT current source 152 may include a resistor-capacitor (RC) circuit 174 electrically coupled between supply voltage $V_{DD}$ and ground to prevent PTAT current source 152 from operating in a metastable condition. A metastable condition is a state in which each transistor of the PTAT circuit exhibits a current of zero. To prevent PTAT current source 152 from operating in a metastable condition, circuit structure 150 may include one or more RC circuits 174 operably coupled to PTAT current source 152. RC circuit 174 may include, e.g., a resistor RSU electrically coupled in series with a capacitor CSU, such that charge accumulation in capacitor CSU counteracts the flow of current through one or more devices electrically coupled in parallel with capacitor CSU. RC circuit 174 thus introduces an intentional imbalance between branches of PTAT current source 152 during startup operations to prevent a metastable condition. In the example of FIG. 5, one or more transistors (e.g., transistor M4) of PTAT current source 152 may be an FDSOI transistor with a back-gate terminal with an adjustable threshold voltage. RC circuit 174 may be electrically coupled to the back-gate terminal of one or more FDSOI transistors in PTAT current source at a junction between resistor RSU and capacitor CSU.

RC circuit 174, where included in circuit structure 150, may bias the back-gate voltage of a selected transistor (e.g., M4) to offset the behavior of other transistors with a different current ramping profile. Operational differences between individual transistors of circuit structure 150 may pose a risk of circuit structure 150 operating in a metastable condition. The presence of RC circuit 174 coupled to the back-gate of one or more transistors may prevent PTAT current source 152 from operating in a metastable condition during transient operation (e.g., startup). During steady-state operation, capacitor CSU will have no significant effect on the generated PTAT current IPTAT. Although one RC circuit 174 is shown as electrically coupled to one transistor M4 in FIG. 5, it is understood that multiple RC circuits 174 optionally may be coupled to respective transistors to provide similar effects throughout PTAT current source 152.

Figure 6:
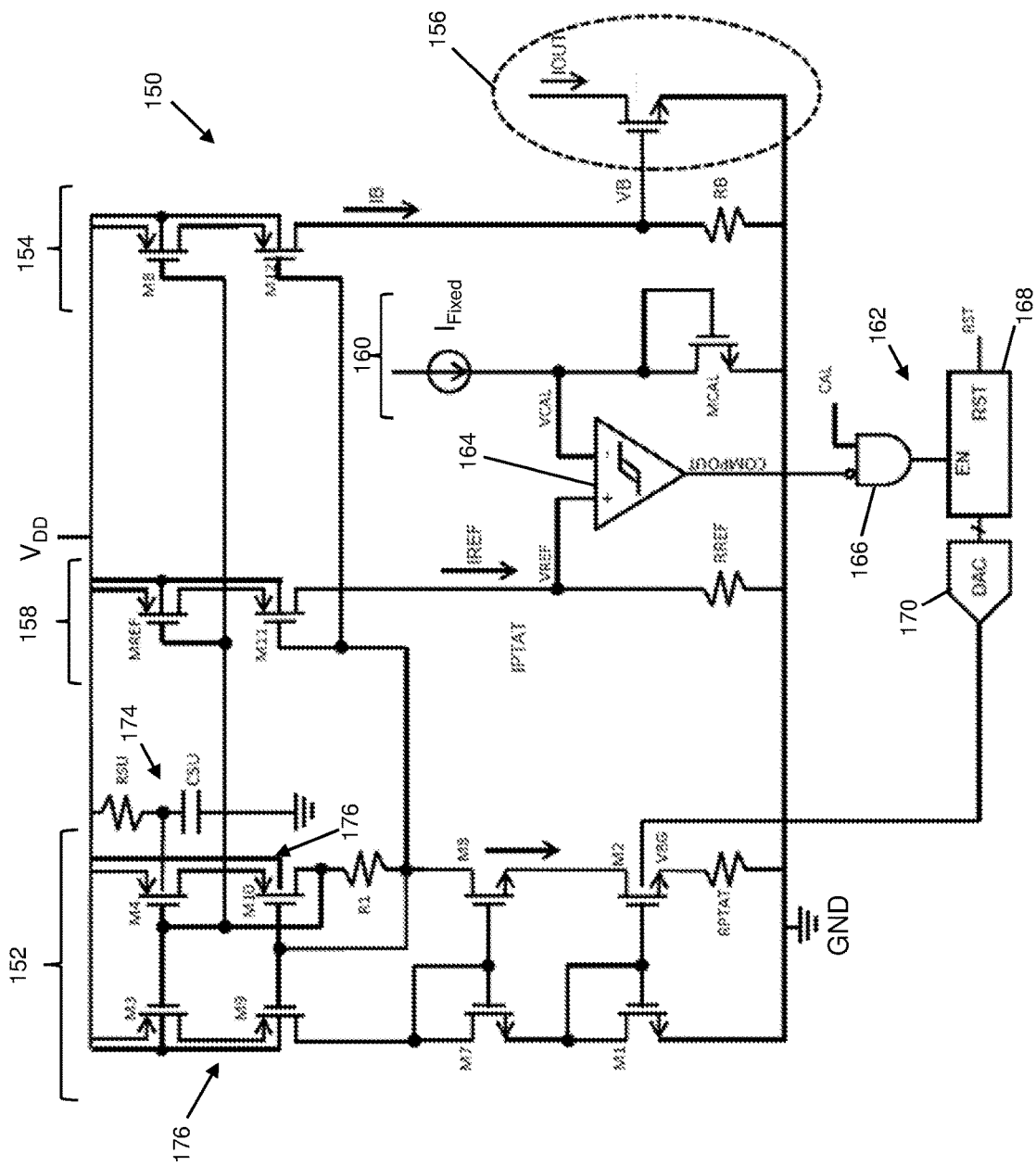
FIG. 6 shows a schematic view of a circuit structure with a cascode amplifier according to embodiments of the disclosure.

Turning to FIG. 6 further embodiments of circuit structure 150 may include PTAT current source 152 with at least one cascoded stage 176 included therein. Cascoded stage 176 may include an amplifier circuit constructed from two interconnected transistors, one or more of which may be an FDSOI transistor as described elsewhere herein. In the example of FIG. 6, cascoded stage 176 is structured to increase an output impedance of PTAT current source 152, e.g., by having two transistors coupled to the gate terminal of access transistor MB of first current mirror 154, and/or otherwise being coupled to first and second current mirrors 154, 158 as shown in FIG. 6. Despite the addition of cascoded stage 176 to PTAT current source 152, circuit structure 150 may operate substantially identically to other embodiments described herein, e.g., where cascoded stage 176 is omitted. Cascoded stage 176 may also work in tandem with RC circuit 174 to provide stability during transient operation, along with the heightened output impedance offered through cascoded stage 176.

Figure 7:
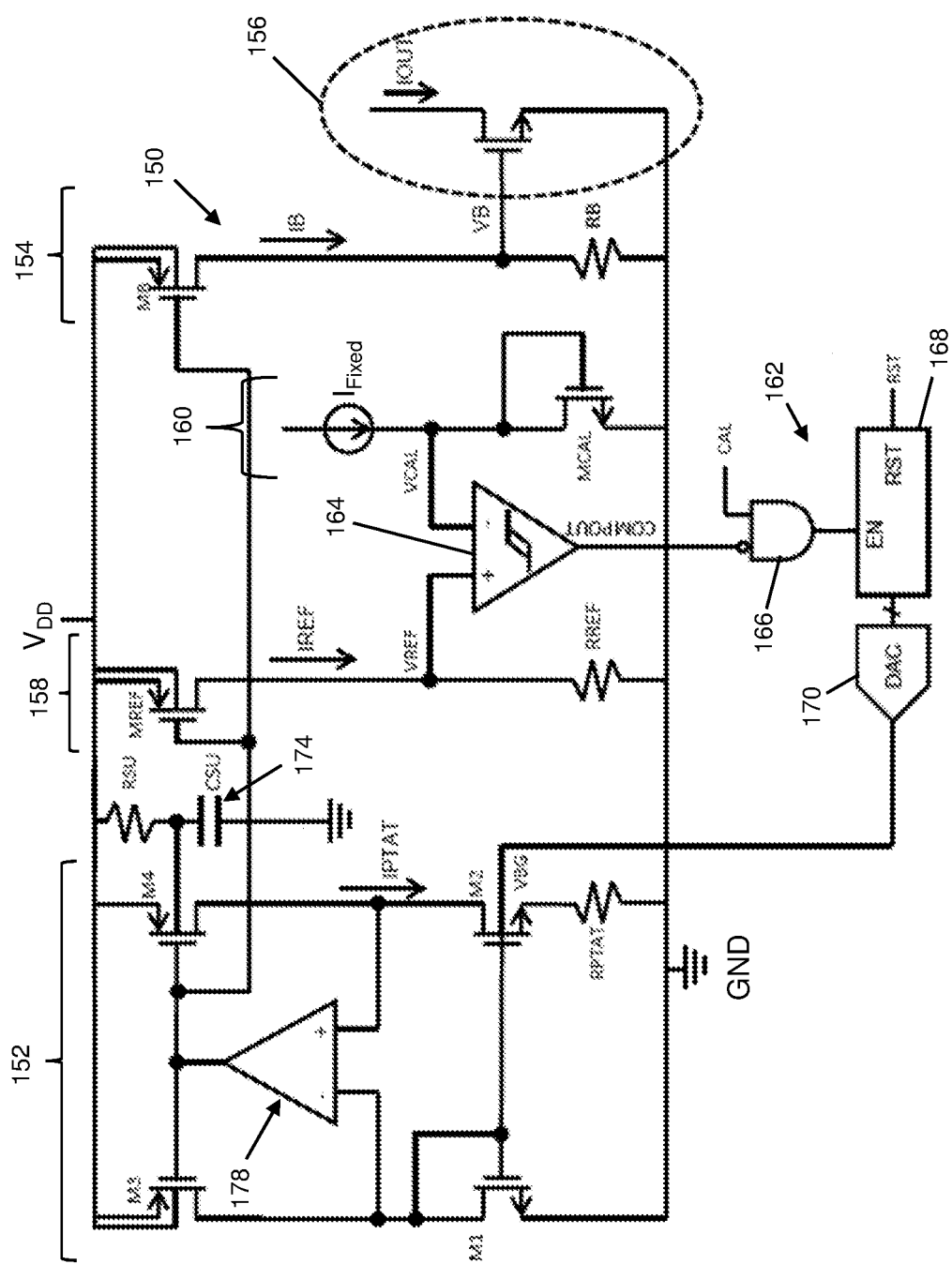
FIG. 7 shows a schematic view of a circuit structure with an operational amplifier according to embodiments of the disclosure

Referring now to FIG. 7, further embodiments of the disclosure may include PTAT current source 152 with an operational amplifier 178 included therein. As shown, operational amplifier 178 is coupled to first current mirror 154 through enabling transistor MB. The amplified gate voltage being applied to enabling transistor MB will increase the output impedance of PTAT current source 152. As with other embodiments described herein, it is possible for RC circuit 174 and operational amplifier 178 to be used together in one PTAT current source 152 without changing the location and characteristics of other components within circuit structure 150. Thus, first current mirror 154, second current mirror 158, calibration circuit 160, and/or calibration engine 162 may remain electrically coupled to PTAT current source 152 substantially as described for other embodiments.

Figure 8:
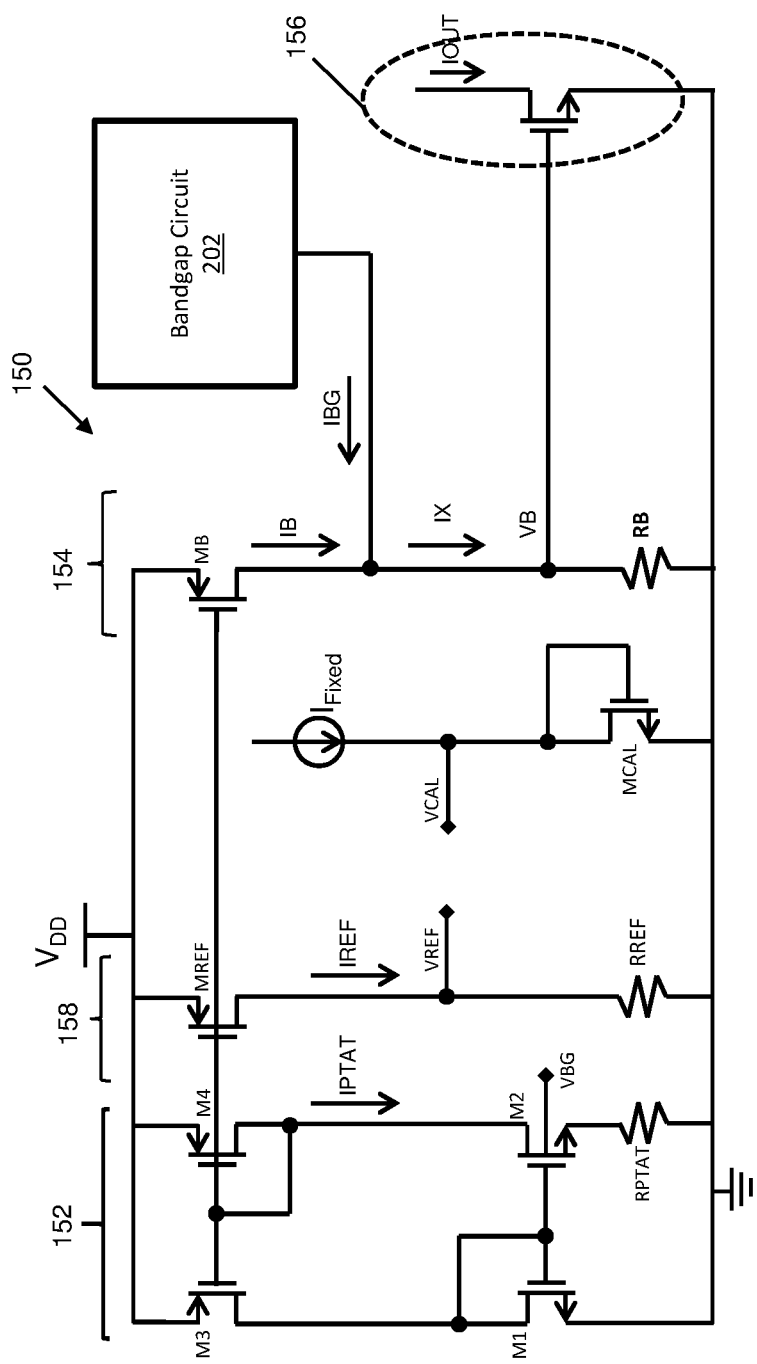
FIG. 8 shows a schematic view of a circuit structure integrated with a bandgap circuit according to embodiments of the disclosure.

Turning to FIG. 8, circuit structure 150 may be adapted to mix a compensated PTAT current with the output from a bandgap circuit 200 to control the temperature sensitivity of output current TOUT. As described elsewhere herein, circuit structure 150 causes output current TOUT (FIGS. 2-7) to exhibit a fixed magnitude independent of variations in supply voltage, temperature, process variations, etc. However, further embodiments of circuit structure 150 to control the sensitivity of output current TOUT to temperature. To provide this feature, bandgap circuit 200 may be connected at its output to the junction between first current mirror 154 and the gate terminal of device transistor 156. An output current IBG from bandgap circuit 202 may mix with bias current IB to produce a mixed current IX at the gate of device transistor 156. Bandgap circuit 200 may be embodied as any currently known or later developed circuit architecture for producing a PTAT output current by way of a transistor diode operated at a constant current. The resulting mixed current IX is proportionate to absolute temperature, as a result of bias current IB being mixed with bandgap current IBG. An operator may determine the mixing ratio of bias current IBG to bias current IB. By adjusting the mixing ratio between currents IB and IBG, an operator may control the temperature sensitivity of output current TOUT. Regardless of whether bandgap circuit 202, circuit structure 150 may function and/or be calibrated identically or substantially similarly to other embodiments discussed herein.

Figure 9:
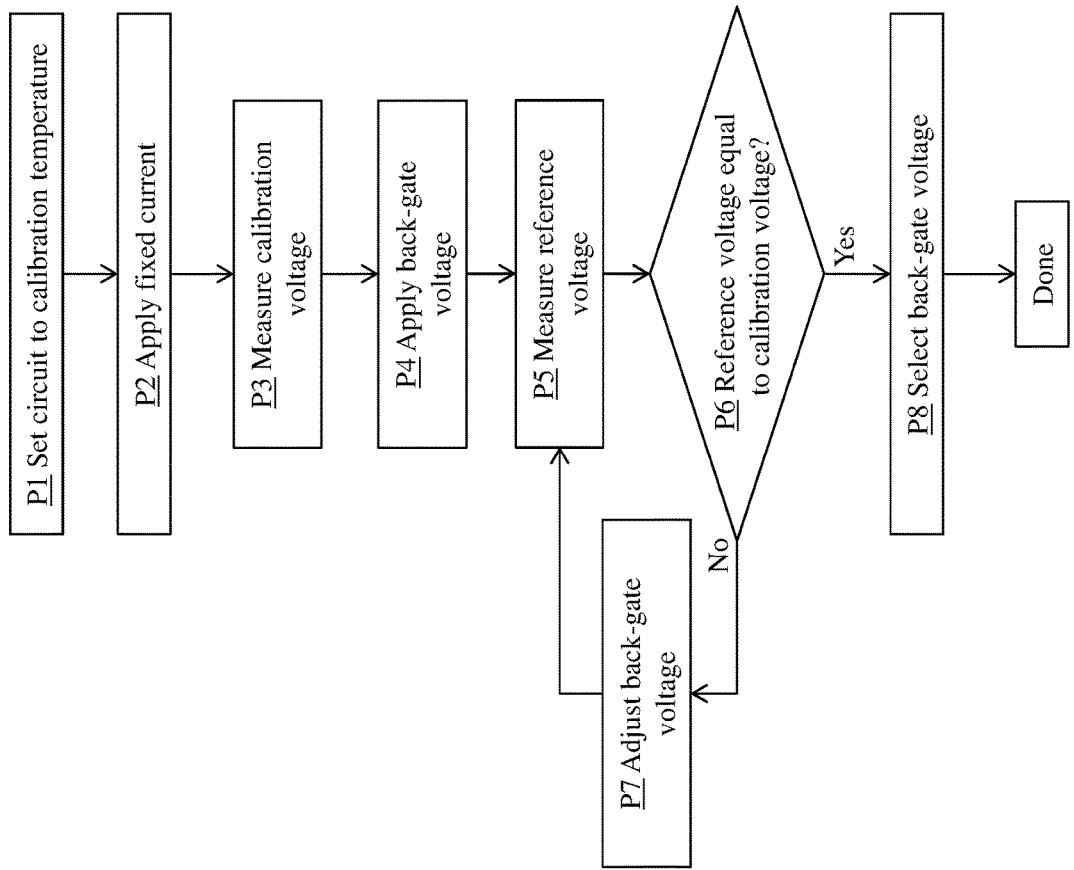
FIG. 9 provides an example flow diagram for implementing methods according to embodiments of the disclosure.

Referring to FIGS. 5 and 9 together, embodiments of the disclosure provide a method to calibrate circuit structure 150 to compensate for process variations of device transistor 156, i.e., manufacturing-based variances between projected and actual operating behavior of the transistor. Methods according to the disclosure may be used with any conceivable embodiment of circuit structure 150, including those illustrated in FIG. 2, and 4-7. The embodiment of FIG. 5 with calibration engine 162 is discussed herein solely for the sake of example.

Process P1 of methods according to the disclosure may include setting circuit structure 150 to a predetermined calibration temperature, e.g., any temperature suitable for distinguishing process variations of device transistor 156 from other performance variables. According to one example, circuit structure 150 may be set to a calibration temperature of 293 K, i.e., room temperature. Calibration at room temperature may be convenient for factory calibration settings, e.g., because it constitutes an approximate midpoint between hot and cold operating temperature. After calibration and selection of a back-gate voltage at room temperature, the entire PTAT curve of circuit structure 150 will be adjusted to reflect process variations of device transistor 156. In other process steps discussed herein, calibration engine 162 and/or an operator of circuit structure 150 may adjust the back-gate voltage applied to PTAT current source 152 to compensate for process variations of device transistor 156. Adjusting the back-gate voltage applied to PTAT current source may cause output current TOUT to be substantially constant over process and temperature variations.

Continuing to process P2, embodiments of the disclosure include applying fixed current $I_{Fixed}$ to the drain terminal of calibration transistor MCAL in calibration circuit 160, e.g., using a fixed current source external to circuit structure 150. Applying fixed current $I_{Fixed}$ to calibration transistor MCAL will yield a corresponding calibration voltage VCAL indicative of an ideal PTAT voltage produced from PTAT current source 152. As discussed elsewhere herein, the continued operation of circuit structure 150 may also cause second current mirror 158 to produce a reference voltage VREF based on PTAT current IPTAT generated by PTAT current source 152. Methods according to the present disclosure use the calibration voltage VCAL produced from applying fixed current $I_{Fixed}$ to calibration transistor MCAL to determine whether the back-gate voltage bias applied to one or more transistors compensates for the process variations of device transistor 156.

Continuing to process P3, methods according to the disclosure may include measuring the calibration voltage VCAL after applying a fixed current to calibration transistor MCAL. The measured calibration voltage VCAL will reflect underlying process variations in calibration transistor MCAL, which itself is replica of device transistor 156. The measured calibration voltage VCAL thus may indicate a desired voltage level for reference voltage VREF in circuit structure 150 to compensate for process variations in device transistor 156.

Continuing to process P4, calibration engine 162 and/or an operator of circuit structure 150 may apply a test voltage to the back-gate terminal of one or more transistors of PTAT current source 152. In the example of FIG. 5, calibration engine 162 uses DAC 170 to apply a selected bias voltage to the back-gate terminal of transistor M2. In other examples, an operator may directly connect another voltage source having a selected voltage to the back-gate terminal of one or more FDSOI transistors. Applying a back-gate voltage to PTAT current source 152 will vary the magnitude of PTAT current IPTAT by a corresponding amount, thereby changing the reference current IREF and reference voltage VREF within second current mirror 158. Subsequently in process P5, the method may include measuring reference voltage VREF as a tested back-gate voltage is being applied to PTAT current source 152.

Process P6 may include determining whether the reference voltage VREF is equal to calibration voltage VCAL. The determining in process P6 may be implemented via calibration engine 162, where applicable. In cases where reference voltage VREF is not equal to calibration voltage VCAL (i.e., "No" at process P6), the method may proceed to process P7 of adjusting the magnitude of the back-gate voltage bias applied to PTAT current source 152 by a predetermined amount. The determination in process P6 may be made using differential comparator 162 and/or other devices for comparing the voltage at two different nodes. In the example of using calibration engine 162 with DAC 170, process P7 may include controller 168 changing a digital input code to DAC 170 by one binary digit to increase or decrease the output voltage applied from DAC 170. In alternative examples, a user may manually adjust the magnitude of the back-gate voltage applied to PTAT current source 152. In the event that reference voltage VREF is equal to calibration voltage VCAL (i.e., "Yes" at process P6), the method may continue to other steps for selecting and using the applied test voltage.

In the event that reference voltage VREF is equal to calibration voltage VCAL, the method may continue to process P8 of applying the test voltage to PTAT current source 152 as a selected back-gate voltage. In some cases, process P8 may include an operator of circuit structure 150 allowing the same back-gate voltage bias to be applied to PTAT current source 152, without further action being necessary. In some cases, the method may conclude ("Done") after process P8 is implemented. One advantage to methods according to the present disclosure is that the calibration process described herein may be implemented only once. Circuit structure 150 may continue to operate with the selected back-gate voltage bias being applied to PTAT current source 152, without further calibration being required.

Embodiments of the disclosure are operable to provide several technical and commercial advantages, some of which are discussed by example herein. Embodiments of the disclosure may provide a single calibration method and/or architecture to compensate for the process variations of a device transistor, without further modification based on the type of device used and/or the applicable procedures for manufacturing a device transistor for generating a PTAT current. Additionally the circuit structure and accompanying method are configured for a single calibration of back-gate bias to transistors in a PTAT current source, thereby eliminating the need for further adjustments and/or recalibrations to fully compensate for process variations of the device transistor. Embodiments of the disclosure apply distinct features of FDSOI technology to provide the various embodiments herein, which would not be possible through the use of conventional transistors. Embodiments of the disclosure are capable of being used with a wide variety of PTAT current source architectures, and may also include additional features (e.g., RC circuit connections) to provide automated calibration and/or additional circuit stability.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
  a current source including at least one fully depleted semiconductor on insulator (FDSOI) transistor having a back-gate terminal, wherein the current source generates a current proportionate to an absolute temperature of the circuit structure;
  a first current mirror electrically coupled to the current source and a gate terminal of a device transistor, wherein the first current mirror applies a gate bias to the device transistor based on a magnitude of the current, and wherein a source or drain terminal of the device transistor includes an output current of the circuit structure; and
  an adjustable voltage source coupled to the back-gate terminal of the at least one FDSOI transistor of the current source, wherein the adjustable voltage source applies a selected back-gate bias voltage to the back-gate terminal of the at least one FDSOI transistor to adjust the current to compensate for process variations of the device transistor.

2. The circuit structure of claim 1, further comprising:
a second current mirror electrically coupled to the current source and a reference resistor, wherein the second current mirror applies the current to the reference resistor and a voltage across the reference resistor defines a reference voltage; and
a calibration transistor having a drain terminal coupled to a fixed current source and a gate terminal of the calibration transistor, and a source terminal coupled to ground, wherein a voltage at the drain terminal of the calibration transistor defines a calibration voltage, the calibration transistor being a replica of the device transistor,
wherein the selected back-gate bias voltage causes the reference voltage to be equal to the calibration voltage.

3. The circuit structure of claim 2, further comprising:
a resistor coupled between the current source and ground; and
a bias resistor coupled between the first current mirror, wherein the resistor, the bias resistor, and the reference transistor each have a same material composition.

4. The circuit structure of claim 2, wherein the adjustable voltage source comprises a calibration engine configured to measure the reference voltage and the calibration voltage.

5. The circuit structure of claim 4, wherein the calibration engine is further configured to:
apply a test voltage to the back-gate terminal of the at least one FDSOI transistor of the current source;
adjust a magnitude of the test voltage in response to detecting the reference voltage as unequal to the calibration voltage; and
continue applying the test voltage as the selected back-gate voltage bias in response to detecting the reference voltage as equal to the calibration voltage.

6. The circuit structure of claim 4, wherein the calibration engine includes a digital-to-analog converter (DAC) configured to output the selected back-gate voltage bias based on a selected digital input code.

7. The circuit structure of claim 1, wherein the current source further includes an additional FDSOI transistor having a respective back-gate terminal, and wherein the respective back-gate terminal is coupled to a resistor-capacitor (RC) circuit configured to transition the current source from operating in a metastable condition to a stable condition.

8. The circuit structure of claim 1, further comprising an operational amplifier coupled to the current source, wherein the operational amplifier increases an output impedance of the current source.

9. The circuit structure of claim 1, wherein the current source further includes a cascode amplifier coupled to the first current mirror, wherein the cascode amplifier increases an output impedance of the current source.

10. The circuit structure of claim 1, further comprising a bandgap circuit coupled to a node between the first current mirror and a gate terminal of the device transistor, wherein the gate bias is further based on a bandgap current from the bandgap circuit, and wherein a mixing ratio of the current and the bandgap current controls a temperature sensitivity of the output current.

11. A method for calibrating a circuit having a proportional to absolute temperature (PTAT) current source coupled to a gate of a device transistor, a source or drain terminal of the device transistor including an output current of the circuit, the method comprising:
applying a fixed current to a drain terminal of a calibration transistor, the calibration transistor including a gate terminal coupled to the drain terminal and a source terminal coupled to ground, wherein the calibration transistor is a replica of the device transistor and the voltage of the drain terminal defines a calibration voltage;
applying a test voltage to a back-gate terminal of at least one fully depleted semiconductor on insulator (FDSOI) transistor of the PTAT current source to adjust a PTAT current generated with the PTAT current source;
applying a mirror of the adjusted PTAT current to a reference resistor, wherein a voltage across the reference resistor defines a reference voltage for calibration;
adjust a magnitude of the test voltage in response to detecting the reference voltage as unequal to the calibration voltage; and
applying the test voltage as a selected back-gate voltage bias in response to detecting the reference voltage as equal to the calibration voltage.

12. The method of claim 11, further comprising mixing the output current with a bandgap reference current to generate a bias current, after applying the test voltage as the selected back-gate voltage bias.

13. The method of claim 11, further comprising setting the circuit to a calibration temperature for applying the fixed current to the drain terminal of the calibration transistor.

14. The method of claim 11, further comprising determining, via a comparator, whether the reference is voltage to the calibration voltage.

15. The method of claim 14, wherein adjusting the magnitude of the test voltage includes causing a digital to analog converter (DAC), coupled to the comparator, to increase or decrease the test voltage by a predetermined value after detecting the reference voltage as unequal to the calibration voltage.

16. The method of claim 14, wherein applying the test voltage as the selected back-gate voltage bias includes disabling the comparator to prevent the DAC from further modifying the test voltage, after detecting the reference voltage as equal to the calibration voltage.

17. The method of claim 11, further comprising applying an additional back-gate bias to an additional FDSOI transistor of the PTAT current source, wherein the additional back-gate terminal is coupled to a resistor-capacitor (RC) circuit for transitioning the PTAT current source from operating in a metastable condition to a stable condition.

18. A circuit structure comprising:
a current source having a plurality of transistors and configured to generate a proportional to absolute temperature (PTAT) current, wherein the plurality of transistors includes at least one fully depleted semiconductor on insulator (FDSOI) transistor having a back-gate terminal, wherein the current source further includes an additional FDSOI transistor having a respective back-gate terminal, and wherein the respective back-gate terminal is coupled to a resistor-capacitor (RC) circuit configured to transition the current source from operating in a metastable condition to a stable condition;
a first current mirror configured to apply a gate bias to a device transistor based on a magnitude of the PTAT current, wherein a source or drain terminal of the device transistor includes an output current of the circuit structure;
an adjustable voltage source coupled to the back-gate terminal of the at least one FDSOI transistor of the current source and configured to apply a selected back-gate bias voltage thereto, wherein the selected back-gate bias voltage adjusts the PTAT current to compensate for process variations of the device transistor;

a second current mirror coupled to a reference resistor and configured to apply the PTAT current to the reference resistor, wherein a voltage across the reference resistor defines a reference voltage; and a calibration transistor having a drain terminal coupled to a fixed current source and a gate terminal of the calibration transistor, and a source terminal coupled to ground, wherein a voltage at the drain terminal of the calibration transistor defines a calibration voltage, and the calibration transistor is a replica of the device transistor, wherein the selected back-gate bias voltage causes the reference voltage to be equal to the calibration voltage.

19. The circuit structure of claim 18, further comprising:

a PTAT resistor coupled between the PTAT current generator and ground; and a bias resistor coupled between the first current mirror and ground, wherein the PTAT resistor, the reference resistor, and the bias resistor have a same material composition.

20. The circuit structure of claim 19, wherein the adjustable voltage source comprises a calibration engine electrically coupled to the reference resistor and the calibration transistor, and configured to:

apply a test voltage to the back-gate terminal of the at least one FDSOI transistor of the current source;

adjust a magnitude of the test voltage in response to detecting the reference voltage as unequal to the calibration voltage; and continue applying the test voltage as the selected back-gate voltage bias in response to detecting the reference voltage as equal to the calibration voltage.

* * * * *